(12) United States Patent
Kimura et al.

(10) Patent No.: US 9,459,287 B2
(45) Date of Patent: Oct. 4, 2016

(54) GUIDE PLATE FOR PROBE CARD (71) Applicants: Japan Electronic Materials Corporation, Amagasaki-shi, Hyogo (JP); Shinko Electric Industries Co., LTD., Nagano-shi, Nagano (JP)

(72) Inventors: Teppei Kimura, Amagasaki (JP); Akinori Shiraishi, Nagano (JP); Kosuke Fujihara, Nagano (JP)

(73) Assignees: JAPAN ELECTRONIC MATERIALS CORPORATION (JP); SHINKO ELECTRIC INDUSTRIES CO., LTD. (JP)

( * ) Notice: Subject to any disclaimer, the term of this patent is extended or adjusted under 35 U.S.C. 154(b) by 232 days.

(21) Appl. No.: 14/206,896

(22) Filed: Mar. 12, 2014

(65) Prior Publication Data
US 2014/0266275 A1 Sep. 18, 2014

(30) Foreign Application Priority Data
Mar. 18, 2013 (JP) ................................. 2013-054498

(51) Int. Cl.
*G01R 1/073* (2006.01)
(52) U.S. Cl.
CPC ................................. *G01R 1/07357* (2013.01)
(58) Field of Classification Search
None
See application file for complete search history.

(56) References Cited

U.S. PATENT DOCUMENTS

| | | | | |
|---|---|---|---|---|
| 6,114,240 A * | 9/2000 | Akram | ................. | H01L 21/486 257/E21.511 |
| 7,279,776 B2 * | 10/2007 | Morimoto | ......... | H01L 21/76898 257/621 |
| 7,902,643 B2 * | 3/2011 | Tuttle | ................ | H01L 21/76898 257/659 |
| 2005/0150683 A1 * | 7/2005 | Farnworth | ............ | H01L 21/486 174/255 |
| 2006/0071347 A1 * | 4/2006 | Dotta | ..................... | H01L 21/486 257/781 |
| 2008/0081386 A1 * | 4/2008 | Raravikar | ......... | H01L 21/76898 438/15 |
| 2013/0009322 A1 * | 1/2013 | Conn | .................. | H01L 23/5384 257/774 |
| 2014/0266274 A1 | 9/2014 | Shiraishi et al. | | |

FOREIGN PATENT DOCUMENTS

| | | |
|---|---|---|
| JP | 2002296297 A | 10/2002 |
| JP | 2003-215163 A | 7/2003 |
| JP | 2004317492 A | 11/2004 |
| JP | 2007171139 A | 7/2007 |
| JP | 5073482 B2 | 8/2012 |
| JP | 2014-032020 A | 2/2014 |

* cited by examiner

*Primary Examiner* — Paresh Patel
(74) *Attorney, Agent, or Firm* — Kilyk & Bowersox, P.L.L.C.

(57) ABSTRACT

The invention provides a guide plate for a probe card including a silicon substrate including a surface and a through-hole, an edge part of the through-hole, and a curved-face part. The through-hole is configured to guide a probe and includes an inner wall face. The edge part of the through-hole is constituted by the surface of the silicon substrate and the inner wall face of the through-hole. The curved-face part is formed on the edge part and formed of a silicon dioxide film.

9 Claims, 4 Drawing Sheets

GUIDE PLATE FOR PROBE CARD

CROSS-REFERENCE TO RELATED APPLICATIONS

The present application claims priority under 35 U.S.C. §119 of Japanese Patent Application No. 2013-054498 filed on Mar. 18, 2013, the disclosure of which is expressly incorporated by reference herein in its entity.

BACKGROUND OF THE INVENTION

1. Technical Field

The present invention relates to a guide plate for a probe card for guiding a probe.

2. Background Art

When a probe card is used to examine operation of a semiconductor device on a semiconductor wafer, probes must be accurately guided to electrodes of the semiconductor device. The tip ends of the probes are guided using a guide plate for a probe card. JP 2003-215163 A discloses a guide plate for a probe card of a ceramic plate having a thermal expansion coefficient similar to that of a semiconductor wafer. The ceramic plate is provided with a plurality of through-holes for guiding probes. The through-holes guide probes such that the tip ends of the probes are accurately positioned so as to come into contact with electrodes of the semiconductor device. The through-holes are formed using mechanical processing or laser processing.

SUMMARY OF INVENTION

In recent years, the miniaturization of semiconductor devices results in that the electrodes of the semiconductor devices must be downsized and arranged at tighter pitches, creating a demand for thinner probes for probe cards. To meet this demand, also sought after are guide plates for probe cards with smaller through-holes at tighter pitches. For example, there is a need for a guide plate for a probe card with several tens of thousands of 90 μm×90 μm rectangular through-holes in a region of about 50 mm×50 mm However, it is difficult to form such minute through-holes at tight pitches in a guide plate for a probe card like the above conventional guide plate for a probe card using mechanical processing or laser processing.

Under these circumstances, the inventors of the present invention considered replacing ceramic plates with silicon substrates, which are easier to process. However, silicon substrates are fragile compared to ceramic plates, so that edge parts of through-holes may possibly be destroyed by probes contacting them. Also, silicon substrates are not electrically insulative, causing an inconvenience of electrical connection between probes that come into contact with the inner walls of the through-holes. Therefore, the inventors were not able to utilize silicon substrates for guide plates.

To address this problem, the inventors analyzed the state of destruction at edge parts of minute through-holes of silicon substrates, and have discovered that destruction can be prevented by partially reinforcing the edges. They also have overcome the above electrical problem by forming insulating films over the entire regions of inner walls of the through-holes, and developed a guide plate using a silicon substrate to perfection. It is known to use an oxide or nitride film to protect a silicon layer in manufacturing semiconductor devices (see JP 5073482 B1). A thin oxide film is effective as a protective film to address a chemical environment but insufficient to resist destruction by mechanical force. Therefore, this technique has not been applied to guide plates.

The invention has been made in view of the above circumstances. The invention provides a guide plate for a probe card capable of coping with decrease in size and pitch of through-holes, by increasing the mechanical strength at the edge parts of the through-holes. The invention also provides a guide plate for a probe card capable of providing electrical insulation between probes.

A guide plate for a probe card of the invention includes a silicon substrate including a surface and a through-hole, an edge part of the through-hole, and a curved-face part. The through-hole is configured to guide a probe and includes an inner wall face. The edge part of the through-hole is constituted by the surface of the silicon substrate and the inner wall face of the through-hole. The curved-face part is formed on the edge part and formed of a silicon dioxide film.

In the guide plate for a probe card according to this aspect of the invention, a plurality of minute through-holes can be formed at a time with tight pitches in the silicon substrate by photolithography and etching. Moreover, the curved-face part of the silicon dioxide film on the edge part of the through-hole can enhance the mechanical strengths of the edge part of the through-hole. Also, when the probe is guided into the through-hole, the curved-face part on the edge part of the through-hole can reduce the possibility of the probe scratching the edge part. Therefore, this aspect of the invention can suppress the problems that the probe may be scraped by the edge part of the through-hole, and/or that the probe may destroy the edge part of the through-hole. Furthermore, it is easy to make the curved-face part on the edge part of the through-hole of the silicon substrate, simply by thermally oxidizing the edge part and thereby increasing the volume of the edge part.

The through-hole may include a substantially rectangular through-hole body and four grooves. The through-hole body may include four walls and four corners. Adjacent walls of the four walls may meet at the corners. The four grooves may be respectively made in the corners. The inner wall face of the through-hole may include the walls of the through-hole body, and the walls may be configured to guide a probe having a rectangular cross section.

In the guide plate for a probe card according to this aspect of the invention, when a probe with a rectangular cross section is guided by the walls of the generally rectangular through-hole body, the existence of the grooves can prevent collision of a corner of the probe with the inner wall face of the through-hole. Therefore, this aspect of the invention can suppress the possibility of abrasion of the corner of the probe and/or the inner wall face of the through-hole due to collision of the corner of the probe with the inner wall face of the through-hole.

The silicon dioxide film on the edge part may have a thickness of 5 μm or larger. In the guide plate for a probe card according to this aspect of the invention, it is possible to effectively suppress the problems that the probe may be scraped by the curved-face part, and/or that the probe may destroy the curved-face part and/or wear out the inner wall and/or the curved-face part.

An inner wall part may be formed on the inner wall face of the through-hole. The inner wall part may be formed of a silicon dioxide film.

The guide plate for a probe card according to this aspect of the invention can be fabricated such that the guide plate formed with the through-hole is simply placed in a high temperature environment in an oxygen atmosphere to make the edge part and the inner wall face of the through-hole thermally oxidized to form the silicon dioxide film. The curved-face part and the inner wall part of the silicon dioxide film provide perfect electrical insulation, so that probes in contact with the curved-face parts and/or the inner wall parts will not be electrically connected to other probes via the guide plate. This aspect of the invention thus facilitates fabrication of a guide plate for a probe card with a silicon dioxide film serving as a mechanical and electrical protective layer.

DESCRIPTION OF EMBODIMENTS

Figure 1A:
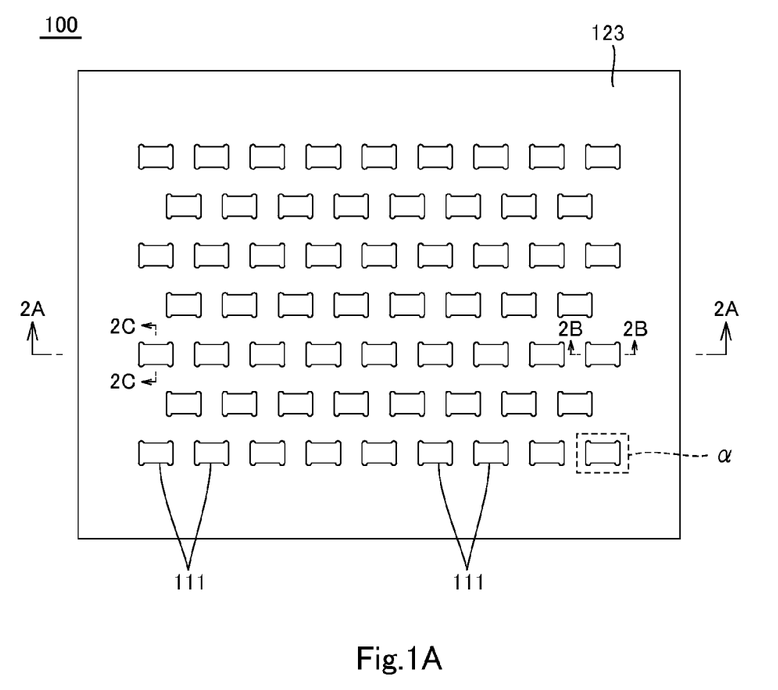
FIG. 1A is a schematic plan view of a guide plate for a probe card according to an embodiment of the invention.
Figure 1B:
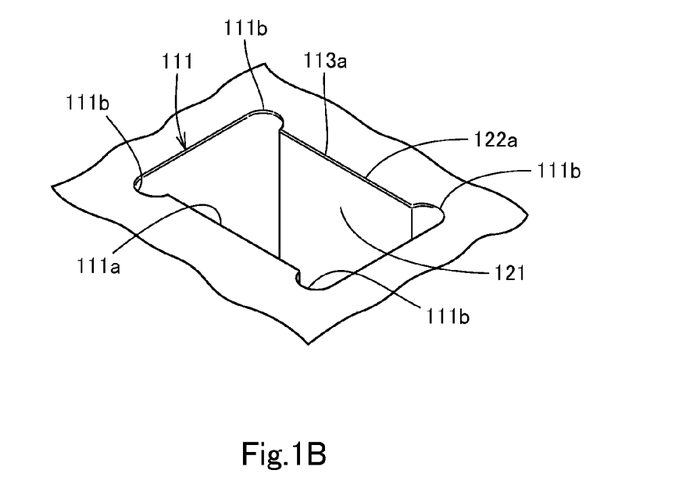
FIG. 1B is an enlarged perspective view of area a of the guide plate in FIG. 1A.
Figure 2A:
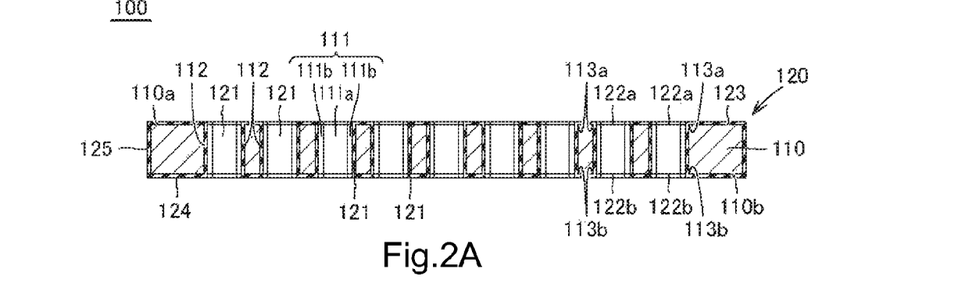
FIG. 2A is a cross-sectional view of the guide plate taken along 2A-2A in FIG. 1A.
Figure 2B:
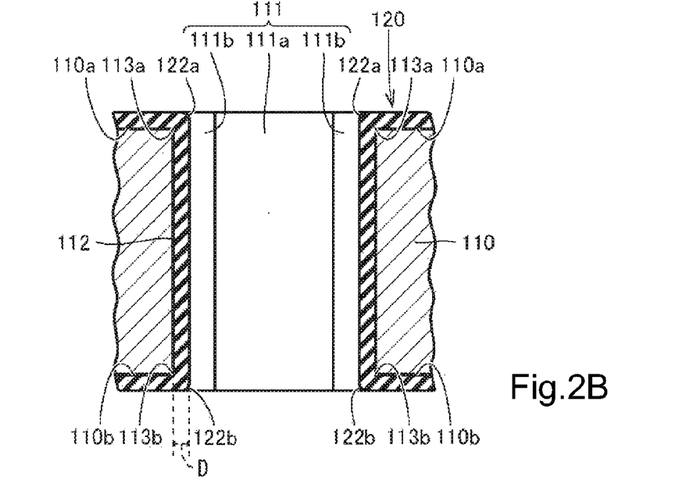
FIG. 2B is an enlarged cross-sectional view of the guide plate taken along 2B-2B in FIG. 1A.

Hereinafter, a guide plate 100 for a probe card according to an embodiment of the invention will be described with reference to FIGS. 1A to 2C. The guide plate 100 for a probe card as shown in FIGS. 1A and 2A includes a silicon substrate 110 and a silicon dioxide film 120. These constituents of the guide plate 100 for a probe card will be described in detail.

The silicon substrate 110 is a plate of monocrystalline silicon, polycrystalline silicon, or amorphous silicon. As shown in FIGS. 1A to 2C, the silicon substrate 110 includes a main face 110a (the upper face in FIG. 2A, the "surface" of the silicon substrate in the claims), a back face 110b (the lower face in FIG. 2A, the "surface" of the silicon substrate in the claims), an outer peripheral face, a plurality of through-holes 111, inner wall faces 112 of the through-holes 111, and edge parts 113a and 113b of the through-holes 111.

The through-holes 111 penetrate the silicon substrate 110 in its thickness direction, and they are located at positions corresponding to the positions of a plurality of electrodes of a semiconductor wafer or a semiconductor device. The through-holes 111 each include a through-hole body 111a and four grooves 111b. The through-hole body 111a is a substantially rectangular hole that penetrates the silicon substrate 110 in the thickness direction. The grooves 111b are arc-shaped holes extending along the respective four corners of the through-hole body 111a (the four walls of the through-hole body 111a meet at the corners). The grooves 111b communicate with the through-hole body 111a and extend through the thickness of the silicon substrate 110.

Figure 2C:
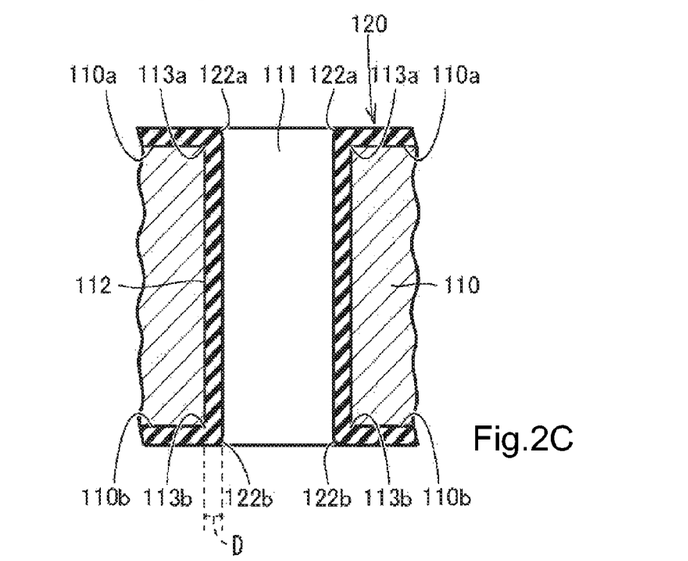
FIG. 2C is an enlarged cross-sectional view of the guide plate taken along 2C-2C in FIG. 1A.

The inner wall faces 112 each include the four walls of the through-hole body 111a and walls of the four grooves 111b. As shown in FIGS. 1B to 2B, the edge parts 113a are annular corner portions formed of the main face 110a of the silicon substrate 110 and the inner wall faces 112 of the through-holes 111. As shown in FIGS. 2A and 2C, the edge parts 113b are annular corner portions formed of the back face 110b of the silicon substrate 110 and the inner wall faces 112 of the through-holes 111.

As shown in FIGS. 1A to 2C, the silicon dioxide film 120 is an insulating layer on the main face 110a, the back face 110b, the outer peripheral face, and the inner wall faces 112 and the edge parts 113a and 113b of the through-hole 111 of the silicon substrate 110, formed by thermally oxidizing the main face 110a, the back face 110b, the outer peripheral face, and the inner wall faces 112 and the edge parts 113a and 113b of the through-hole 111. The thickness dimension D of the silicon dioxide film 120 is preferably between about 3 μm and about 10 μm, and more preferably about 5 μm or larger. This is because the silicon dioxide film 120 having a thickness dimension D of about 5 μm or larger are resistant to several hundred thousand to two million times of sliding movements of probes 200 (to be described). It is not desirable to provide the silicon dioxide film 120 as having a thickness dimension D of 10 μm or larger because this configuration requires a longer process time for forming the silicon dioxide film 120. However, the invention allows for the possibility of the thickness of the silicon dioxide film 120 as 10 μm or larger.

The silicon dioxide film 120 includes inner wall parts 121, curved-face parts 122a and 122b, a main face part 123, a back face part 124, and an outer peripheral part 125. The inner wall parts 121 are provided on and over the respective inner wall faces 112 of the through-holes 111. The curved-face parts 122a are provided on and over the edge parts 113a of the through-holes 111, and the curved-face parts 122b are provided on and over the edge parts 113b of the through-holes 111. The curved-face parts 122a and 122b are continuous with the inner wall part 121. The existence of the curved-face parts 122a and 122b make the edge parts 113a and 113b of the through-holes 111 rounded in arc shape. The main face part 123 is provided on and over the main face 110a of the silicon substrate 110. The main face part 123 is continuous with the curved-face parts 122a. The back face part 124 is provided on and over the back face 110b of the silicon substrate 110. The back face part 124 is continuous with the curved-face parts 122b. The outer peripheral part 125 is provided on and over the outer peripheral face of the silicon substrate 110. The outer peripheral part 125 is continuous with the main face part 123 and the back face part 124. It should be noted that the silicon dioxide film may be provided entirely on the areas between the through-holes 111 of the silicon substrate 110. For example, in the case where the through-holes 111 of the silicon substrate 110 are provided at pitches of 15 μm, if the thickness dimension D of the silicon dioxide film 120 is 7.5 μm or larger, the silicon dioxide film will be formed in the entire areas between the through-holes 111 of the silicon substrate 110.

The guide plate 100 for a probe card configured as described above may be fabricated in the following manner. First, a silicon substrate is prepared. Next, a resist is applied on the main face or the back face of the silicon substrate. The resist is then exposed and developed through a mask, so that a plurality of openings is made in the resist at positions corresponding to the through-holes 111. Then, the substrate is subjected to dry etching by a Bosch process in an RIE apparatus to form the through-holes 111 in the silicon substrate. The silicon substrate thus becomes the silicon substrate 110. Then, the resist is removed from the silicon substrate 110.

Next, the silicon substrate 110 is heated for 40 hours (2,400 minutes) at 1000° C. by means of a wet oxidation method to thermally oxidize the outer faces (the main face 110*a*, the back face 110*b*, and the outer peripheral face) of the silicon substrate 110, the inner wall faces 112 of the through-holes 111, and the edge parts 113*a* and 113*b* of the through-holes 111. This causes increase in volume of the main face 110*a*, the back face 110*b*, and the outer peripheral face of the silicon substrate 110, and the inner wall faces 112 and the edge parts 113*a* and 113*b* of the through-holes 111. As a result, the silicon dioxide film 120 (the main face part 123, the back face part 124, the outer peripheral part 125, the inner wall parts 121, and the curved-face parts 122*a* and 122*b*) is formed on and over the main face 110*a*, the back face 110*b*, the outer peripheral face, and the inner wall faces 112 and the edge parts 113*a* and 113*b* of the through-holes 111 of the silicon substrate 110. It should be noted that a dry oxidation method may alternatively be employed to form the silicon dioxide film 120 on the silicon substrate 110.

Figure 3:
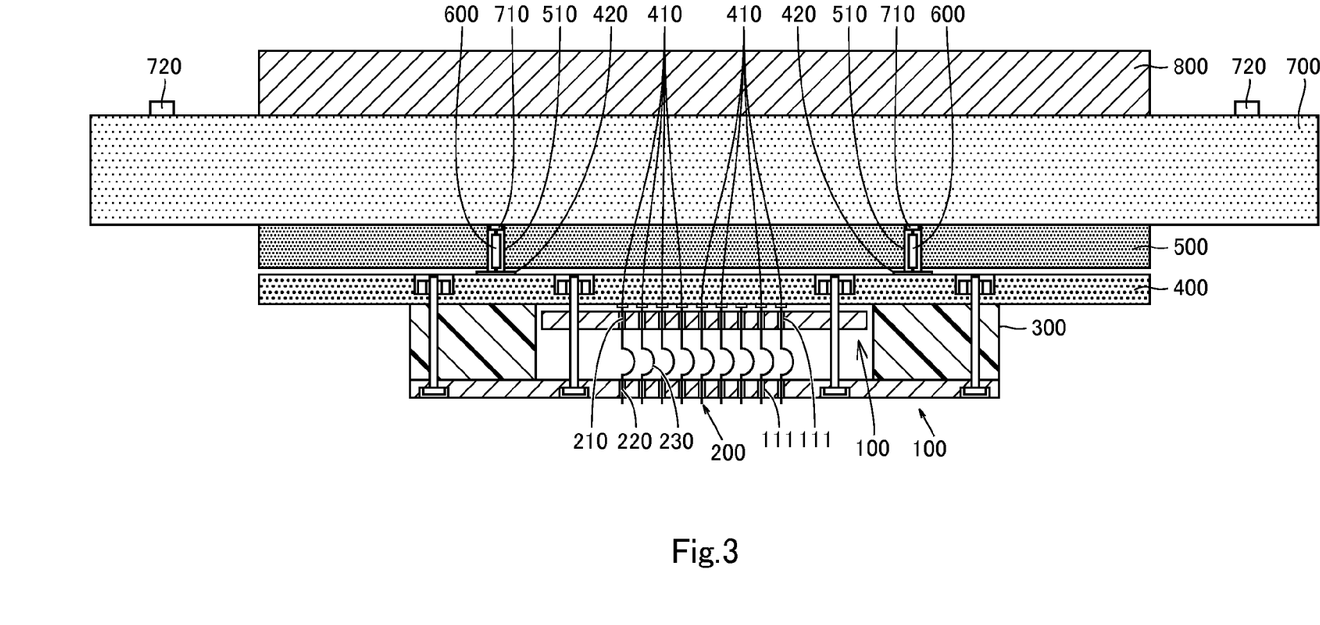
FIG. 3 is a schematic cross-sectional view of a probe card according to an embodiment of the invention.
Figure 4A:
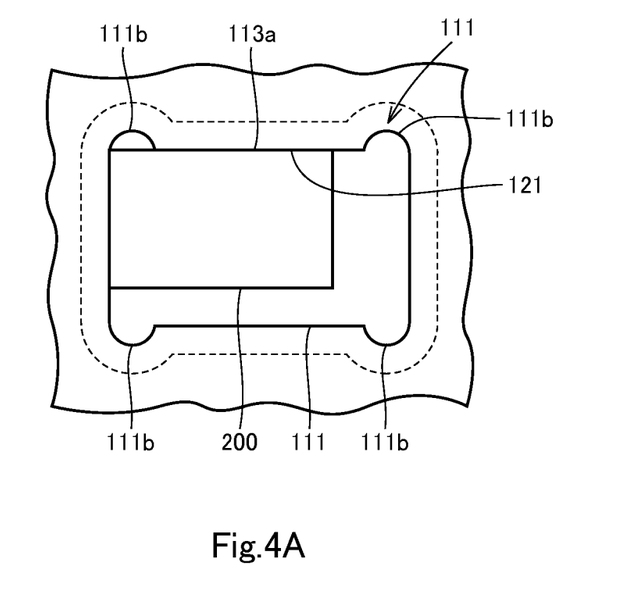
FIG. 4A is an explanatory view showing a positional relationship of the guide plate for a probe card and a probe of the probe card.

There is now described a probe card according to an embodiment of the invention with reference to FIGS. 3 and 4A. The probe card shown in FIG. 3 includes two of the guide plates 100 for a probe card as described above, a plurality of probes 200, a spacer 300, a wiring substrate 400, an intermediate substrate 500, a plurality of spring probes 600, a main substrate 700, and a reinforcement plate 800. These constituents of the probe card will be described in detail below. For the convenience of explanation and the distinction of the two guide plates 100, the guide plate 100 positioned on the tip side of the probes 200 will be referred to as a probe-tip-side guide plate 100, and the guide plate 100 for a probe card positioned on the base side of the probes 200 will be referred to as a probe-base-side guide plate 100.

The main substrate 700 is a printed circuit board. The main substrate 700 includes a first face, and a second face on the backside of the first face. A plurality of electrodes 710 are provided on the first face of the main substrate 700, and a plurality of external electrodes 720 are provided near opposite ends of the second face of the main substrate 700. The electrodes 710 are connected to the external electrodes 720 via a plurality of conductive lines (not shown), which may be provided on the first face, on the second face and/or inside the main substrate 700.

The reinforcement plate 800 is a plate-like member that is harder than the main substrate 700 (for example, a plate of stainless steel or the like material). The reinforcement plate 800 is screwed to the second face of the main substrate 700. The reinforcement plate 800 serves to suppress warping of the main substrate 700.

The intermediate substrate 500 is fixed to the first face of the main substrate 700, and it is disposed between the main substrate 700 and the wiring substrate 400. A plurality of through-holes 510 pass through the intermediate substrate 500 in its thickness direction, at positions corresponding to those of the electrodes 710 of the main substrate 700.

The wiring substrate 400 is a space transformer (ST) substrate. The wiring substrate 400 is fixed to the main substrate 700 and the reinforcement plate 800 by fixing screws (not shown) to extend on the lower side as shown in FIG. 3 of the intermediate substrate 500 and in parallel to the main substrate 700. The wiring substrate 400 includes a first face, and a second face on the backside of the first face. A plurality of electrodes 410 are arranged on the first face of the wiring substrate 400, at positions corresponding to those of the through-holes 111 of the probe-tip-side and probe-base-side guide plates 100. Also, a plurality of electrodes 420 are arranged at spaced positions on the second face of the wiring substrate 400. More particularly, the electrodes 420 are on the same vertical line as the electrodes 710 of the main substrate 700. The electrodes 420 are connected to the electrodes 410 via conductive lines (not shown), which may be provided on the first face, on the second face, and/or inside the wiring substrate 400.

The spring probes 600 are received in the respective through-holes 510 of the intermediate substrate 500 to be interposed between the electrodes 710 of the main substrate 700 and the electrodes 420 of the wiring substrate 400. The spring probes 600 thus electrically connect between the electrodes 710 and the electrodes 420.

The probe-tip-side and probe-base-side guide plates 100 are different from each other in that the probe-base-side guide plate 100 has smaller outer dimensions than the probe-tip-side guide plate 100. The probe-tip-side guide plate 100 is fixed to the wiring substrate 400 with bolts and nuts, in parallel to and in spaced relation to the wiring substrate 400. The spacer 300 is interposed between end portions of the probe-tip-side guide plate 100 and the wiring substrate 400. The probe-base-side guide plate 100 is fixed to the wiring substrate 400 with bolts and nuts, in parallel to and in spaced relation to the wiring substrate 400. The probe-base-side guide plate 100 is located between the wiring substrate 400 and the probe-tip-side guide plate 100. The through-holes 111 of the probe-tip-side guide plate 100 are arranged on the vertical lines passing through the through-holes 111 of the probe-base-side guide plate 100.

The probes 200 are each a needle having a rectangular cross section perpendicular to its length, as shown in FIG. 4A. As shown in FIG. 3, each probe 200 includes first and second end portions 210 and 220, and an elastic deformation portion 230. The first end portion 210 is a lengthwise end portion of the probe 200 and passes through one of the through-holes 111 of the probe-base-side guide plate 100. The first end portion 210 is slidable on the inner wall part 121 and/or the curved-face parts 122*a* and 122*b* of the through-hole 111. The inner wall parts 121 and the curved-face parts 122*a* and 122*b* provide electrical insulation between the first end portion 210 and the silicon substrate 110 of the probe-base-side guide plate 100. The first end portion 210 is in contact with and soldered to a corresponding one of the electrodes 410 of the wiring substrate 400. The second end portion 220 is the other lengthwise end portion of the probe 200 (i.e. the end portion at the opposite side of the first end portion 210) and passes through one of the through-holes 111 of the probe-tip-side guide plate 100. The second end portion 220 is slidable on the inner wall part 121 and the curved-face parts 122*a* and 122*b* of the through-hole 111. The inner wall part 121 and the curved-face parts 122*a* and 122*b* provide electrical insulation between the second end portion 220 and the silicon substrate 110 of the probe-tip-side guide plate 100. The second end portion 220 is contactable with an electrode of a semiconductor wafer or semiconductor device. In short, the probes 200 are guided by the through-holes 111 of the probe-base-side guide plate 100 and the probe-tip-side guide plate 100 in such a manner as to contact the associate electrodes of the semiconductor wafer or semiconductor device. The elastic deformation portion 230 of each probe 200 is provided between the first and second end portions 210 and 220 and curved generally in a C-shape.

The probe card as described above is attached to a prober of a tester to measure various electrical properties of a semiconductor wafer or semiconductor device. Specifically, the prober sets the probe card and the semiconductor wafer or semiconductor device in face to face relationship, and then the probe card and the semiconductor wafer or the semiconductor device are brought relatively close to each other. The second end portions 220 of the probes 200 of the probe card are brought into contact with and pressed against the electrodes of the semiconductor wafer or semiconductor device (i.e. the second end portions 220 are placed under load). Then, the loads cause the elastic deformation portions 230 of the probes 200 to be elastically deformed and bent, and the probes 200 are bent on the whole. The first and second end portions 210 and 220 of the probes 200 thereby become tilted and slide on the associated inner wall parts 121 and/or the curved-face parts 122a and 122b of the silicon dioxide films 120 of the probe-base-side guide plate 100 and the probe-tip-side guide plate 100 (see FIG. 4). During the time when the second end portions 220 of the probes 200 are in contact with the electrodes of the semiconductor wafer or the semiconductor device, the tester measures various electrical properties of the semiconductor wafer or semiconductor device.

The probe card as described above has at least the following technical features. Firstly, a plurality of minute through-holes 111 can be formed at a time with tight pitches in the silicon substrate 110 of the guide plate 100 for a probe card by photolithography and etching. The etching method used is dry etching by Bosch process, making it possible to make the through-holes 111 with high accuracy and with high aspect ratio.

Secondly, the silicon dioxide film 120 is provided on the inner wall faces of the through-holes 111 and the edge parts 113a and 113b of the through-holes 111, enhancing the mechanical strengths of the inner wall faces 112 and the edge parts 113a and 113b. The curved-face parts 122a and 122b of the silicon dioxide film 120 are provided on the edge parts 113a and 113b of the through-holes 111, reducing the possibility that the probe 200 as sliding may scratch the edge parts 113a. Consequently, even when the probes 200 inserted through the through-holes 111 slide on the inner wall parts 121 and/or the curved-face parts 122a and 122b of the silicon dioxide film 120 of the through-hole 111 to contact the electrode of the semiconductor device or the semiconductor wafer, the above configurations of the through-holes 111 with the silicon dioxide film 120 can suppress the problems that the probes 200 may be scraped by the curved-face parts 122a and 122b, that the probes 200 may destroy the curved-face parts 122a and 122b, and that the inner wall parts 121 and/or the curved-face parts 122a and 122b may be eliminated by abrasion. Particularly, these problems were more effectively suppressed by setting the thickness dimensions D of the inner wall parts 121 and the curved-face parts 122a and 122b as about 5 μm.

Figure 4B:
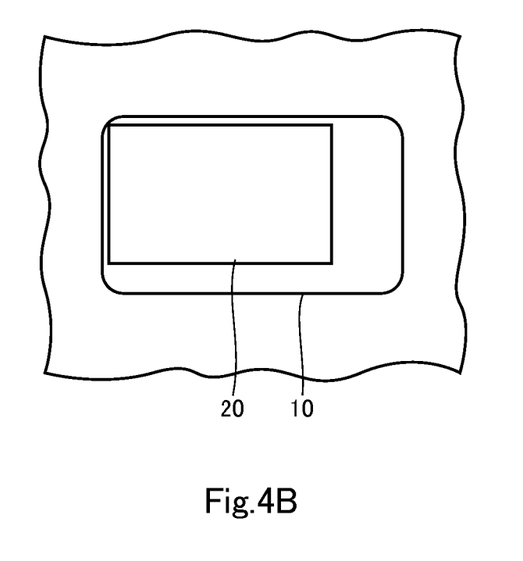
FIG. 4B is an explanatory view showing a positional relationship of a guide plate for a probe card and a probe according to a comparative example.

FIG. 4B illustrates a probe card of a comparative example, in which rectangular through-holes 10 are made in a silicon substrate by photolithography and etching. The corners (portions where the four walls meet) of each through-hole 10 are curved (rounded). When probes 20 having a rectangular cross-section slide in the through-hole 10, the corners of the probe 20 slide on the curved corners of the through-hole 10, and the curved corners of the through-hole 10 are easily chipped or eliminated by abrasion. This is in contrast with the guide plate 100 for a probe card, wherein each through-hole 111 has the grooves 111b along the corners (portions where the four walls meet) of the through-hole body 111a as shown in FIG. 4A. Accordingly, when each probe 200 (the first and second end portions 210 and 220) having a rectangular cross section is guided (slides) in face-to-face relationship with the walls of the through-hole body 111a of the through-hole 111, the existence of the grooves 111b can prevent collision of the corners of the probe 200 with the inner wall part 121 of the through-hole 111. This configuration can also suppress chipping or elimination by abrasion of the inner wall parts 121 of the through-holes 111.

Further advantageously, the silicon dioxide film 120 is easy to make by thermally oxidizing the silicon substrate 110. Particularly, simply by thermally oxidizing the edge parts 113a and 113b of the through-holes 111, the edge parts 113a and 113b increase in volume to form the curved-face parts 122a and 122b of the silicon dioxide film 120, i.e. the curved-face parts 122a and 122b are easy to make.

As is known to the skilled person, when the second end portions 220 of the probes 200 come into contact with the electrodes of a semiconductor device or semiconductor wafer, high-frequency current flows through the probes 200, generating Joule heat. However, the first and second end portions 210 and 220 of the probes 200 are in contact with the silicon substrate 110 during the Joule heat generation, allowing dissipation of the Joule heat through the silicon substrate 110. It is therefore possible to reduce the possibility of melt fracture and brittle fracture of the minute probes 200 due to the Joule heat.

It should be noted that the guide plate for a probe card and the probe card described above are not limited to the embodiment described above, but may be modified in any manner within the scope of the claims. Specific modifications will be described in detail below.

In the above embodiment, the through-holes 111 of the silicon substrate 110 each include the through-hole body 111a and the grooves 111b. However, the through-hole(s) of the invention may be any through-hole(s) that passes through the silicon substrate in the thickness direction thereof and receives (guides) a probe therethrough. For example, the through-hole(s) of the silicon substrate may be polygonal or circular. The through-hole(s) may be made by dry etching the silicon substrate by a Bosch process as in the above embodiment, but it may also be made in the silicon substrate by any other etching method.

The silicon dioxide film 120 of the above embodiment includes the inner wall parts 121, the curved-face parts 122a and 122b, the main face part 123, the back face part 124, and the outer peripheral part 125. However, the silicon dioxide film of the invention may be of any configuration including a curved-face part or parts on the edge part(s) constituted by a surface of the silicon substrate and the inner wall face(s) of the through-hole(s). For example, the silicon dioxide film may include an inner wall face part on an inner wall face of a through-hole of the silicon substrate, and a curved-face part on an edge part that is constituted by the surface of the silicon substrate and the inner wall face of the through-hole. The silicon dioxide film 120 may have the inner wall part(s) 121 and the curved-face part(s) 122a. The silicon dioxide film 120 may have the inner wall part(s) 121 and the curved-face part(s) 122b. The silicon dioxide film 120 may have the inner wall part(s) 121, the curved-face part(s) 122a, and the main face part 123. The silicon dioxide film 120 may have the inner wall part(s) 121, the curved-face part(s) 122b, and the back face part 124. The silicon dioxide film 120 may have the inner wall part(s) 121, the curved-face parts 122a and 122b, the main face part 123, and the back face part 124. The silicon substrate may have areas without the silicon dioxide film by masking the substrate at the time of thermal oxidation or other means.

The probes 200 of the above embodiment each include the first and second end portions 210 and 220 and the elastic deformation portion 230. The probe or probes of the invention may have any configuration adapted to pass through a through-hole(s) of a guide plate for a probe card of the embodiment or modification examples described above. For example, the probe(s) may be a straight or cantilever needle or needles. Also in this case, at least one of the first and second lengthwise end portions of the probe may be inserted into a through-hole(s) of a guide plate for a probe card of the embodiment or modification examples described above.

The probes 200 of the above embodiment are slidable on the inner wall parts 121 and/or the curved-face parts 122a and 122b of the through-holes 111 of the guide plate 100 for a probe card. However, the probe(s) of the invention may be initially in contact with the inner wall part(s) of the through-hole(s) of the guide plate for a probe card.

The probes 200 may be formed without the elastic deformation portions 230. The elastic deformation portions 230 of the probe 200 of the above embodiment are generally C-shaped. However, the elastic deformation portion(s) of the probe(s) of the invention may be of any shape that allows elastic deformation when a load is applied to the second end portion(s) of the probe(s) to bring the probe(s) into contact with the inner wall part(s) and/or the curved-face part(s) of the through-hole(s) of the guide plate for a probe card of the embodiment or modification examples described above. For example, the elastic deformation portion(s) may be generally of boomerang shape or slanted shape.

The probe card may be provided without the intermediate substrate 500, the spring probe 600, the main substrate 700, and/or the reinforcement plate 800. Also, the wiring substrate may or may not be connected to another substrate (such as the main substrate). The wiring substrate itself may be used as the main substrate. The wiring substrate may be electrically connected to another substrate with the spring probes 600 or with probes of any type, an FPC, a cable, or any other known connection means.

It should be appreciated that the embodiments and modifications are described above by way of examples only. The materials, shapes, dimensions, numbers, arrangements, and other configurations of the constituents of the guide plate for a probe card and the probe card may be modified in any manner if they can perform similar functions. The probe card of the invention should include at least one guide plate.

REFERENCE SIGNS LIST

100: Guide plate for a probe card
  110: Silicon substrate
    110a: Main face (surface of silicon substrate)
    110b: Back face (surface of silicon substrate)
    111: Through-hole
      111a: Through-hole body
      111b: Groove
    112: Inner wall face
    113a: Edge part
    113b: Edge part
  120: Silicon dioxide film
    121: Inner wall part
    122a: Curved-face part
    122b: Curved-face part
    123: Main face part
    124: Back face part
    125: Outer peripheral part
200: Probe
  210: First end portion
  220: Second end portion
  230: Elastic deformation portion
300: Spacer
400: Wiring substrate
500: Intermediate substrate
600: Spring probe
700: Main substrate
800: Reinforcement plate

The invention claimed is:

1. A guide plate for a probe card, the guide plate comprising:
    a silicon substrate including a surface and a through-hole, the through-hole being configured to guide a probe and including an inner wall face;
    an edge part of the through-hole, the edge part being constituted by the surface of the silicon substrate and the inner wall face of the through-hole; and
    a curved-face part formed on the edge part, the curved-face part being formed of a silicon dioxide film, being rounded in an arc shape, and extending from the surface of the silicon substrate to the inner wall face of the through-hole.

2. A guide plate for a probe card, the guide plate comprising:
    a silicon substrate including a surface and a through-hole, the through-hole being configured to guide a probe and including an inner wall face;
    an edge part of the through-hole, the edge part being constituted by the surface of the silicon substrate and the inner wall face of the through-hole; and
    a curved-face part formed on the edge part, the curved-face part being formed of a silicon dioxide film,
    wherein the through-hole comprises:
        a substantially rectangular through-hole body, the through-hole body including:
            four walls, and
            four corners, at which adjacent walls of the four walls meet, and
        four grooves respectively made in the corners, and
        wherein the inner wall face of the through-hole comprises the walls of the through-hole body, the walls being configured to guide the probe having a rectangular cross section.

3. The guide plate for a probe card according to claim 1, wherein the silicon dioxide film on the edge part has a thickness of 5 µm or larger.

4. The guide plate for a probe card according to claim 2, wherein the silicon dioxide film on the edge part has a thickness of 5 µm or larger.

5. The guide plate for a probe card according to claim 1, further comprising:
    an inner wall part formed on the inner wall face of the through-hole, the inner wall part being formed of a silicon dioxide film.

6. The guide plate for a probe card according to claim 2, further comprising:
    an inner wall part formed on the inner wall face of the through-hole, the inner wall part being formed of a silicon dioxide film.

7. The guide plate for a probe card according to claim 3, further comprising:
    an inner wall part formed on the inner wall face of the through-hole, the inner wall part being formed of a silicon dioxide film.

8. The guide plate for a probe card according to claim 4, further comprising:
    an inner wall part formed on the inner wall face of the through-hole, the inner wall part being formed of a silicon dioxide film.

9. In combination, a guide plate for a probe card, and a probe, the guide plate comprising:
  a silicon substrate including a surface and a through-hole, the through-hole being configured to guide a probe and including an inner wall face;
  an edge part of the through-hole, the edge part being constituted by the surface of the silicon substrate and the inner wall face of the through-hole; and
  a curved-face part formed on the edge part, the curved-face part being formed of a silicon dioxide film, being rounded in an arc shape, and extending from the surface of the silicon substrate to the inner wall face of the through-hole;
  the probe comprising a first end portion, the first end portion being a lengthwise end portion of the probe and passing through the through-hole, wherein the first end portion is slidable on the curved-face part.

* * * * *